United States Patent
Mukherjee et al.

(10) Patent No.: US 12,423,489 B2
(45) Date of Patent: Sep. 23, 2025

(54) MODIFYING A FINITE ELEMENT MESH

(71) Applicants: Nilanjan Mukherjee, Cincinnati, OH (US); Jean Cabello, Maineville, OH (US); Jonathan Makem, Cambridge (GB); Wafa Daldoul, Cambridge (GB)

(72) Inventors: Nilanjan Mukherjee, Cincinnati, OH (US); Jean Cabello, Maineville, OH (US); Jonathan Makem, Cambridge (GB); Wafa Daldoul, Cambridge (GB)

(73) Assignee: SIEMENS INDUSTRY SOFTWARE NV, Leuven (BE)

( * ) Notice: Subject to any disclaimer, the term of this patent is extended or adjusted under 35 U.S.C. 154(b) by 1043 days.

(21) Appl. No.: 17/412,637

(22) Filed: Aug. 26, 2021

(65) Prior Publication Data
US 2022/0067242 A1 Mar. 3, 2022

(30) Foreign Application Priority Data
Aug. 28, 2020 (EP) .................................. 20193382

(51) Int. Cl.
*G06F 30/12* (2020.01)
*G06F 30/15* (2020.01)
(Continued)

(52) U.S. Cl.
CPC .............. *G06F 30/23* (2020.01); *G06F 30/15* (2020.01); *G06T 17/205* (2013.01)

(58) Field of Classification Search
CPC ....... G06T 17/205; G06T 17/20; G06T 17/00; G06T 7/62
See application file for complete search history.

(56) References Cited

U.S. PATENT DOCUMENTS

| 8,194,068 B1 | 6/2012 | Staten et al. |
| 2014/0039847 A1 | 2/2014 | Georgescu |

(Continued)

FOREIGN PATENT DOCUMENTS

| CN | 103617603 A | 3/2014 |
| CN | 106683186 A | 5/2017 |

(Continued)

OTHER PUBLICATIONS

Emmanouil Kastrinakis Streamlined Process for Creating a Results Based Optimized Mesh 5th ANSA & μETA International Conference 2013 [retrieved on Feb. 3, 2025] Retrieved from the internet <chromeextension://efaidnbmnnnibpcajpcglclefindmkaj/https://www.betacae.com/events/c5pdf/4B_2_kastrinakis.pdf> (Year: 2013).*

(Continued)

*Primary Examiner* — Rehana Perveen
*Assistant Examiner* — John David Hagler
(74) *Attorney, Agent, or Firm* — Lempia Summerfield Katz LLC

(57) ABSTRACT

A computer-implemented method of modifying a finite element mesh. The method includes providing an original-input-orphan-mesh, selecting and extracting at least a part of the original-input-orphan-mesh as an orphan-element-patch-object, generating faces on the orphan-element-patch-object as a faces-on-mesh-object geometry, generating a new mesh patch element based on the faces-on-mesh-object-geometry and at least one changed meshing-parameter. The changed meshing-parameter is assigned to generate a new mesh patch element that is different to the corresponding original-input-orphan-mesh. The method further includes generating an amended orphan mesh by replacing the orphan-element-patch-object of the original-input-orphan-mesh by the new mesh patch element.

18 Claims, 7 Drawing Sheets

(51) Int. Cl.
*G06F 30/23* (2020.01)
*G06T 17/20* (2006.01)

(56) References Cited

U.S. PATENT DOCUMENTS

| | | | |
|---|---|---|---|
| 2017/0177770 A1 | 6/2017 | Letzelter et al. | |
| 2017/0177771 A1* | 6/2017 | Letzelter | G06F 30/23 |
| 2019/0179984 A1 | 6/2019 | Van Der Velden | |
| 2020/0211279 A1 | 7/2020 | Randon et al. | |

FOREIGN PATENT DOCUMENTS

| | | | | |
|---|---|---|---|---|
| EP | 1826720 A1 * | 8/2007 | | G06K 9/38 |
| JP | 2008310576 A | 12/2008 | | |
| JP | 2017111820 A | 6/2017 | | |
| JP | 2019106187 A * | 6/2019 | | G06F 30/23 |
| JP | 2020115338 A | 7/2020 | | |

OTHER PUBLICATIONS

Barrett, Timothy J., et al. "An automated procedure for geometry creation and finite element mesh generation: Application to explicit grain structure models and machining distortion." Computational materials science 141 (2018): 269-281.

European Search Report for European Application No. 20193382.7-1224 dated Feb. 8, 2021.

Jiao, Xiangmin, and Narasimha R. Bayyana. "Identification of C1 and C2 discontinuities for surface meshes in CAD." Computer-Aided Design 40.2 (2008): 1-31.

Mukherjee, Nilanjan. "A Hybrid, Variational 3D Smoother For Orphaned Shell Meshes." IMR. 2002. pp. 1-12.

Parrish, Michael, et al. "A selective approach to conformal refinement of unstructured hexahedral finite element meshes." Proceedings of the 16th international meshing roundtable. Springer, Berlin, Heidelberg, 2008. pp. 1-18.

Schneiders, Robert. "Refining quadrilateral and hexahedral element meshes." transition 2 (1996): 1. pp. 1-10.

Scott, Micheal, Matthew L. Staten, and Steven E. Benzley. A methodology for quadrilateral finite element mesh coarsening. No. SAND2006-4979J. Sandia National Laboratories, 2006. pp. 1-62.

Thilakarathna, P. S. M., et al. "Understanding fracture mechanism and behaviour of ultra-high strength concrete using mesoscale modelling." Engineering Fracture Mechanics 234 (2020): 107080. pp. 1-25.

Chong, C. S., A. Senthil Kumar, and H. P. Lee. "Automatic mesh-healing technique for model repair and finite element model generation." Finite Elements in Analysis and Design 43.15 (2007): 1109-1119.

* cited by examiner

MODIFYING A FINITE ELEMENT MESH

CROSS REFERENCE TO RELATED APPLICATIONS

This patent document claims the benefit of EP 20193382.7 filed on Aug. 28, 2020 which is hereby incorporated in its entirety by reference.

FIELD

Embodiments are directed to modifying a finite element mesh.

BACKGROUND

Currently many industrial engineering analysis problems deal with legacy analysis data originating from sources that are lost or obsoleted. In the area of finite element analysis one such common legacy data are finite element meshes, complete or partial that are "orphaned" from geometry. This means the meshes are barely a collection of connected nodes and elements that have lost the parent geometry on which they were originally created. A very common example of such orphaned surface mesh from the automotive industry is the assembly mesh of a car door. Quite often designers reuse car doors from older models with minor feature modifications and/or newer mesh prescriptions. One such car door CRDR is shown in FIG. 1. In such cases to be able to change an existing mesh EXMS—to remesh—that has been orphaned from its owning geometry is of paramount importance. This is illustrated in FIG. 2 showing the remeshed mesh RMMS of the car door CRDR. The ability to remesh existing meshes leads to a notable increase in productivity and a compression of design cycles.

The paper MUKHERJEE NILANJAN: "A Hybrid, 1-11 Variational 3D Smoother for Orphaned Shell Meshes", (INTERNATIONAL MESHING ROUNDTABLE, XX, XX, 15 Sep. 2002 (2002, Sep. 15), pages 379-390, XP002307517) deals with orphaned meshes. A different term for orphaned meshes may be 'geometry-dissociated mesh' or 'legacy finite element mesh'.

Further, the paper of THILAKARATHNA PS MET AL: "Understanding fracture mechanism and behavior of ultrahigh strength concrete using mesoscale modelling" (ENGINEERING FRACTURE MECHANICS, ELSEVIER, AMSTERDAM, NL, vol. 234, 24 May 2020 (2020, May 24), XP086177558, ISSN: 0013-7944, DOI: 10.1016/J.ENGFRACMECH.2020.107080) deals with orphaned meshes.

Further, the paper of BARRETT TIMOTHY J ET AL: "An automated 1-11 procedure for geometry creation and finite element mesh generation: Application to explicit grain structure models and machining distortion" (COMPUTATIONAL MATERIALS SCIENCE, vol. 141, 5 Oct. 2017 (2017, Oct. 5), pages 269-281, XP085244425, ISSN: 0927-0256, DOI: 10.1016/J.COMMATSCI.2017.09.048) deals with orphaned meshes.

From "Basu, D., Cabello, J., Hancock, M.: Abstraction on legacy finite element data—re-meshing, surface generation and morphing, US National Congress on Computational Mechanics, Dearborn, 2001" a geometry creation on geometry disassociated legacy meshes is known.

In "Schneiders, R.: Refining Quadrilateral and Hexahedral Element Meshes. Numerical Grid Generation in Computational Field Simulations 1, 679-688 (1996)" and in "Parrish, M., Borden, M., Staten, M. L., Benzley, S. E.: A Selective Approach to Conformal Refinement of Unstructured Hexahedral Finite Element Meshes. In: Proceedings of 16th International Meshing Roundtable, pp. 251-268 (2007) aspects of locally refining all-quad meshes and some numerous template-based algorithms have been presented.

Coarsening quad meshes is described in "Staten, M. L., Benzley, S. E., Scott, M.: A Methodology for Quadrilateral Finite Element Mesh Coarsening; Engineering with Computers 24, 241-251 (2008)" and in "Staten, M. L, Woodbury, A. C, Benzley, S. E, Shepherd—J. F, Hexahedral finite element mesh coarsening using pillowing technique, U.S. Pat. No. 8,194,068 B1 (2012)".

Identification of C1 and C2 Discontinuities for Surface Meshes in CAD is known from Xiangmin Jiao and Narasimha R. Bayyana "College of Computing, Georgia Institute of Technology 266 Ferst Drive, Atlanta, GA 30332, USA" published in Computer-Aided Design, Volume 40, Issue 2, February 2008, Pages 160-175.

These previous investigations are limited by the fact that they are not able to generate new meshes on old meshes simultaneously honoring both features and a myriad of mesh constraints. In some academic and commercial codes, it may be possible to remesh on mesh with reasonable feature-sensitivity but in multiple steps.

BRIEF SUMMARY AND DESCRIPTION

The scope of the present invention is defined solely by the appended claims and is not affected to any degree by the statements within this summary. The present embodiments may obviate one or more of the drawbacks or limitations in the related art.

Embodiments deal with feature-sensitive, constraint-aware remeshing of orphan element patches. Embodiments provide: remeshing small local segments or zones of an original mesh at a size different from the original size of the mesh, remeshing tessellated geometry with no topological information (which is an orphan triangular mesh) with a different mesher, remeshing sections of existing meshes to impart local mesh control or characteristics absent from the original mesh—for example, characteristics like layered mesh around holes or cut-outs, altering the number of layers of an already layered mesh, densifying or rarefying the mesh in local areas of interest etc., remeshing at a different mesh size to recover (re-featuring) or ignore features (defeaturing), remeshing local element patches or zones to conform with new loads and boundary conditions, and/or remeshing local element patches in the vicinity of altered geometry to create localized smart mesh updates.

Conventionally the above features may be achieved by deleting the original mesh and remeshing on the original geometry with new mesh definitions. This traditional approach reaches its limits if the mesh is orphaned—then— there will be no geometry to remesh on. "Orphaned" in the context of this application refers to when the respective mesh is only a collection of connected nodes and elements that have lost the parent geometry on which they were originally created. A surface geometry is often given by a surface mesh without a continuous geometry model, such as given by a stereolithographic (STL) mesh, or a mesh obtained from the solutions of dynamic numerical simulations. Thus, remeshing on an orphan patch may serve the dual purpose of recreating through an estimation based on guesses a new virtual geometry as close as possible to what might have been the original. Remeshing generates a new mesh on the orphan patch that honors the revised or completely new mesh definition. All this happens in one single step that makes it a powerful functionality. Previous investigations are limited by the fact that they are not able to generate new meshes on old meshes simultaneously honoring both features and a myriad of mesh constraints. In some academic and commercially available codes it may be possible to remesh on mesh with reasonable feature-sensitivity but in multiple steps.

Furthermore, constraint-aware mesh generation on orphan meshes is conventionally unknown.

Variously disclosed embodiments include methods and computer systems that may be used to facilitate the embodiments as follows.

Embodiments relate to a computer-implemented method of modifying a finite element mesh. The method includes providing an original-input-orphan-mesh. The original-input-orphan-meshes are finite element meshes, complete or partial that are orphaned from the parent geometry on which they were originally created.

The method further includes selecting and extracting at least a part of the original-input-orphan-mesh as an orphan-element-patch-object. The method provides remeshing of the complete original-input-orphan-mesh as well by e.g., selecting the complete original-input-orphan-mesh as the orphan-element-patch-object.

According to an embodiment input-feature-element-edges that correspond to element edges of the original-input-orphan-mesh that are treated as spatially fixed during subsequent method steps may be received.

According to an embodiment boundary-frozen-element-edges including frozen nodes of the orphan-element-patch-object may be received. The frozen nodes are retained during the generating of a new mesh patch element such that no new nodes are created on these edges.

According to an embodiment boundary-frozen-element-edges and/or input-feature-element-edges may be provided by a user interface, that may be a graphical user interface.

The method further includes generating faces on the orphan-element-patch-object as a faces-on-mesh-object geometry. This may be done by creating a faces-on-mesh-object-polygon from the orphan-element-patch-object.

According to an embodiment the faces-on-mesh-object geometry, for example the faces-on-mesh-object-polygon, may be flattened from a 3d-geometry to a 2d-geometry.

According to an embodiment the surface mesh may be generated directly on the 3D surface (wherein the 3D surface means that every node has 3 coordinates, e.g., x,y,z coordinates) that may be an alternative to the flattening into a 2D parameter space of the nodes wherein all nodes have locally only three coordinates, e.g., u,v coordinates. For the case, when flattening from a 3d-geometry to a 2d-geometry was done, the procedure may include a subsequent step of transforming the generated 2D mesh to 3D, that may preferably be the final transformation step.

According to an embodiment the mesh-elements of the orphan-element-patch-object may be changed into smaller or larger mesh-elements forming the basis for generating faces on the orphan-element-patch-object as a faces-on-mesh-object geometry.

According to an embodiment changing into smaller mesh-elements may be done by splitting quadrilateral mesh-elements into trilateral mesh-elements forming the basis for generating faces on the orphan-element-patch-object as a faces-on-mesh-object geometry.

The method further includes generating a new mesh patch element based on the faces-on-mesh-object-geometry and at least one changed meshing-parameter. The changed meshing-parameter is assigned to generate a new mesh patch element that is different to the corresponding original-input-orphan-mesh.

The faces-on-mesh-object-geometry may be considered as a "meta-geometry." The term "meta-geometry" may be understood as not being a fully-fledged geometry as in computer-aided design (CAD), but an intermediate geometry generated only for the purpose of subsequently meshing on it.

Another embodiment may provide that the faces-on-mesh-object-geometry respectively the meta-geometry may be outputted or provided to a user as e.g., facetted or discrete geometry for optionally amending the geometry.

The method further includes generating an amended orphan mesh by replacing the orphan-element-patch-object of the original-input-orphan-mesh by the new mesh patch element.

According to an embodiment a computer-implemented finite element mesh generation method is provided including the method, further including before the step of providing an original-input-orphan-mesh is performed: providing a geometry model of a component, generating an original mesh based on the geometry model, and separating the original mesh from the geometry model as an original-input-orphan-mesh to be provided.

According to an embodiment a computer-implemented finite element mesh generation method is provided including the method, further including after the step of generating an amended orphan mesh: performing a finite element calculation by applying the amended orphan mesh generating at least one calculation result.

According to an embodiment the above defined computer-implemented finite method includes subsequent to the step of performing a finite element calculation by applying the new mesh a post-processing of the at least one calculation result. Such post-processing may include transforming detailed and complex calculation results respectively the calculation output of the Finite Element Method calculations into a format that is easily understood by the user. This may include graphical illustrations, tables, text reports and/or a combination of these. The post-processing outputs may be used in engineering judgements or analysis, as part of validity/functionality checks on the FEM model, or for the purpose of reporting results or for any kind of calculation/FEM-analysis result presentation.

According to an embodiment a method to generate a component according to a design specification including the method is provided. After the step of post-processing the at least one calculation result the method includes: evaluating if a repetition of: a) generating a new mesh patch element based on the faces-on-mesh-object-geometry and at least one changed meshing-parameter and/or b) generating an amended orphan mesh by replacing the orphan-element-patch-object of the original-input-orphan-mesh by the new mesh patch element, is required to obtain a better approximation to the design specification, if applicable repeating steps a) and b), and generating the component based on the design specification.

In this context the term 'if applicable repeating steps a., b.' refers to 'evaluating if a repetition of' and means that a criterion of meeting the design specification (or in other words: criterion of compliance with the design criterion) may be evaluated by e.g., comparing the criterion with a threshold and in case of not meeting the design specification the repetition may be carried out—otherwise not.

According to another embodiment the step of: generating faces on the orphan-element-patch-object as a faces-onmesh-object geometry, includes for identifying singularities of the faces-on-mesh-object geometry the following additional steps: selecting an area from the faces-on-mesh-object geometry as a feature, assigning a respective criterium-score to the feature of the faces-on-mesh-object geometry for distinguishing between a first feature type and a second feature type selected from the feature-types: flat plane, ridge, corner, calculating at least two respective algorithmic criterium scores applied to the feature, determining a total score assigned to the feature as a weighted sum of the criterium scores, comparing the total score to a predefined score-threshold and assigning the first feature type to the feature in case the total score is below the threshold, otherwise assigning the second feature type.

One embodiment of calculating at least two respective algorithmic criterium scores applied to the feature includes a step of: solving a medial quadric at each vertex for eigenvalues $0 \le \lambda_3 \le \lambda_2 \le \lambda_1$ with eigenvectors $E_3$, $E_2$, $E_1$ as $A \cdot x = b$, wherein x is a 3×1 matrix and wherein A is a 3×3 normal matrix (symmetric, positive semi-definite $AA=A^T$, $x^T \cdot A \cdot x \ge 0$)

with $A = \Sigma w_j N_j N_j^t$ with j=surrounding elements to vertex V, wherein $N_j$ is the unit normal vector to triangle j, wherein $w_j$ is the area-weight of triangle j, wherein b is a 3×1 matrix with $b = \Sigma w_j N_j$, wherein the solving for the eigenvalues $0 \le \lambda_3 \le \lambda_2 \le \lambda_1$ with eigenvectors $E_3$, $E_2$, $E_1$ outputs $A = \Sigma \lambda_j E_j E_j^t$, and assigning geometrical properties to the respective vertex: wherein the vertex is scored in favor of being a flat plane in case that exactly one large eigenvalue is determined (flat means A-rank 1 meaning that all normals are identical), wherein the vertex is scored in favor of being a ridge in case that exactly two large eigenvalues are determined (A is of the rank 2 meaning two distinct normal directions), wherein the vertex is scored in favor of being a corner in case that three large eigenvalues determined (A is of rank 3 respectively full-rank).

This method uses the "medial quadric", that uses an eigenvalue analysis to solve a least-squares problem locally at each vertex. This method is explained in "X. Jiao, P. Alexander, Parallel feature-preserving mesh smoothing, in: Proc. Int. Conf. on Comput. Sci. and Appl., 2005, pp. 1180-1189" and mentioned in above referenced publication of Xiangmin Jiao and Narasimha R. Bayyana. The cited teachings regarding the identification of discontinuities or singularities are not repeated here but are incorporated by reference.

Another embodiment of calculating one of the at least two algorithmic criterium scores applied to the feature includes at least one of the following steps: criterium for a dihedral angle assigning a predetermined criterium score for dihedral angle values, assign higher scores for small variation of dihedral angle such that these small variations are more likely respectively favored, mutatis mutandis favor non-jaggedness of virtual edges, mutatis mutandis favor small variation to ridge direction (assuming that the ridge direction is robust, reliable and accurate).

Embodiments may be applied using a computer system arranged and configured to execute the steps of the computer-implemented method according to any combination of the above-described features.

Another embodiment relates to a computer-readable medium encoded with executable instructions, that when executed, cause the computer system to carry out the method or any embodiment of that method. A computer-readable medium is considered being synonym with a computer program product.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Also, before undertaking the detailed description below, it should be understood that various definitions for certain words and phrases are provided throughout this document and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

DETAILED DESCRIPTION

Figure 1:
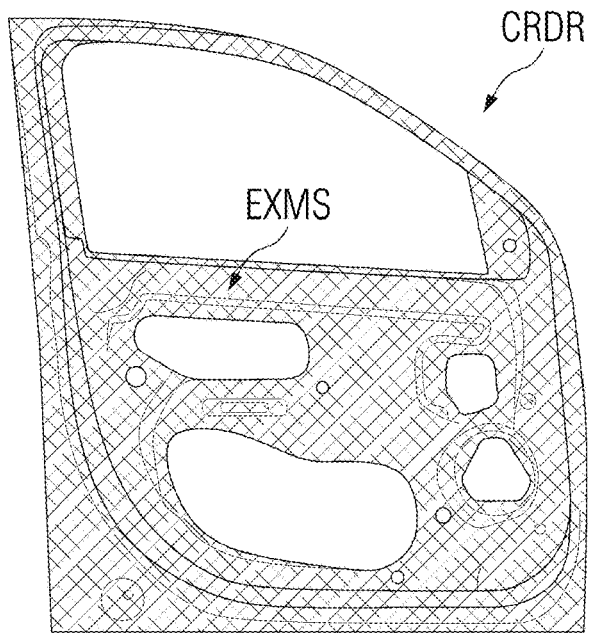
FIGS. 1 and 2 depict car door meshes.
Figure 2:
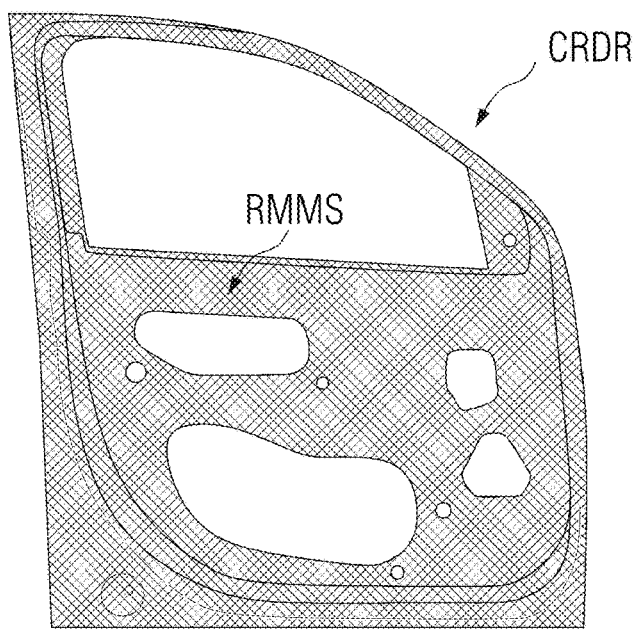
Figure 3:
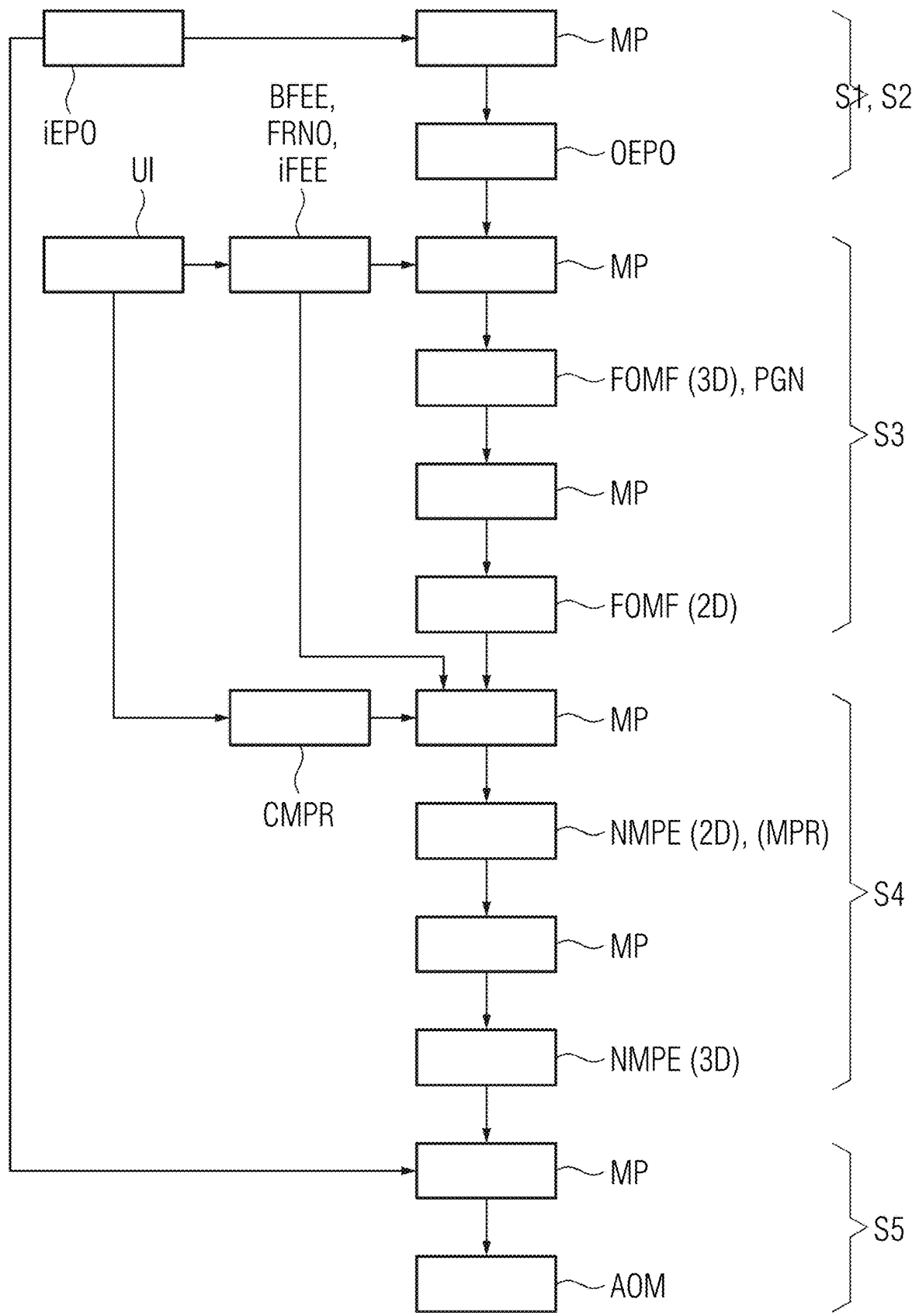
FIGS. 3 and 4 depict flow diagrams of an example methodology that facilitates the remeshing method according to an embodiment.

FIG. 3 depicts a computer-implemented method of modifying a finite element mesh. The method includes the following steps S1-S5: S1: Providing an original-input-orphan-mesh IEPO to a mesh-partitioner-module MP, S2: Selecting and extracting at least a part of the original-input-orphan-mesh IEPO as an orphan-element-patch-object OEPO, S3: Generating faces on the orphan-element-patch-object OEPO as a faces-on-mesh-object geometry FOMF, S4: Generating a new mesh patch element NMPE based on the faces-on-mesh-object-geometry FOMF and at least one changed meshing-parameter CMPR, wherein the changed meshing-parameter CMPR is assigned to generate a new mesh patch element NMPE that is different to the corresponding original-input-orphan-mesh IEPO, S5: Generating an amended orphan mesh AOM by replacing the orphan-element-patch-object OEPO of the original-input-orphan-mesh IEPO by the new mesh patch element NMPE, Before or simultaneously to step S3 boundary-frozen-element-edges BFEE including frozen nodes FRNO of the orphan-element-patch-object OEPO may be received by the mesh-partitioner-module MP. The frozen nodes FRNO are retained during the generating of a new mesh patch element NMPE such that no new nodes are created on these edges. Alternatively, or additionally input-feature-element-edges IFEE that correspond to element edges of the original-input-orphan-mesh IEPO that are treated as spatially fixed during subsequent method steps may be received by the mesh-partitioner-module MP.

Further, during step S3, the mesh-partitioner-module MP may split the mesh-elements MSEL of the orphan-element-patch-object OEPO into smaller or larger mesh-elements MSEL forming the basis for generating faces on the orphan-element-patch-object OEPO as a faces-on-mesh-object geometry FOMF.

Additionally, splitting quadrilateral mesh-elements QLME into trilateral mesh-elements TLME may be done to obtain a more feasible mesh type. As one possibility for making mesh-elements MSEL larger at least two of them may be merged to become a new single mesh-element MSEL.

Generating a new mesh patch element NMPE—step S4—may be done using a known mesher, like the CSALF-Q mesher [CSALF-Q mesher—N. Mukherjee, 'CSALF-Q: A Bricolage Algorithm for Anisotropic Quad Mesh Generation', Proc. XXth International Meshing Roundtable, Paris, France, (2011) pp. 489-510, Springer] that may be preferred for quad elements. As an alternative e.g., a mesher by J.Cabello ['Toward Quality Surface Meshing', Proc. XIIth International Meshing Roundtable, Santa Fe, New Mexico, (2003) pp.201-213] may be used.

Figure 4:
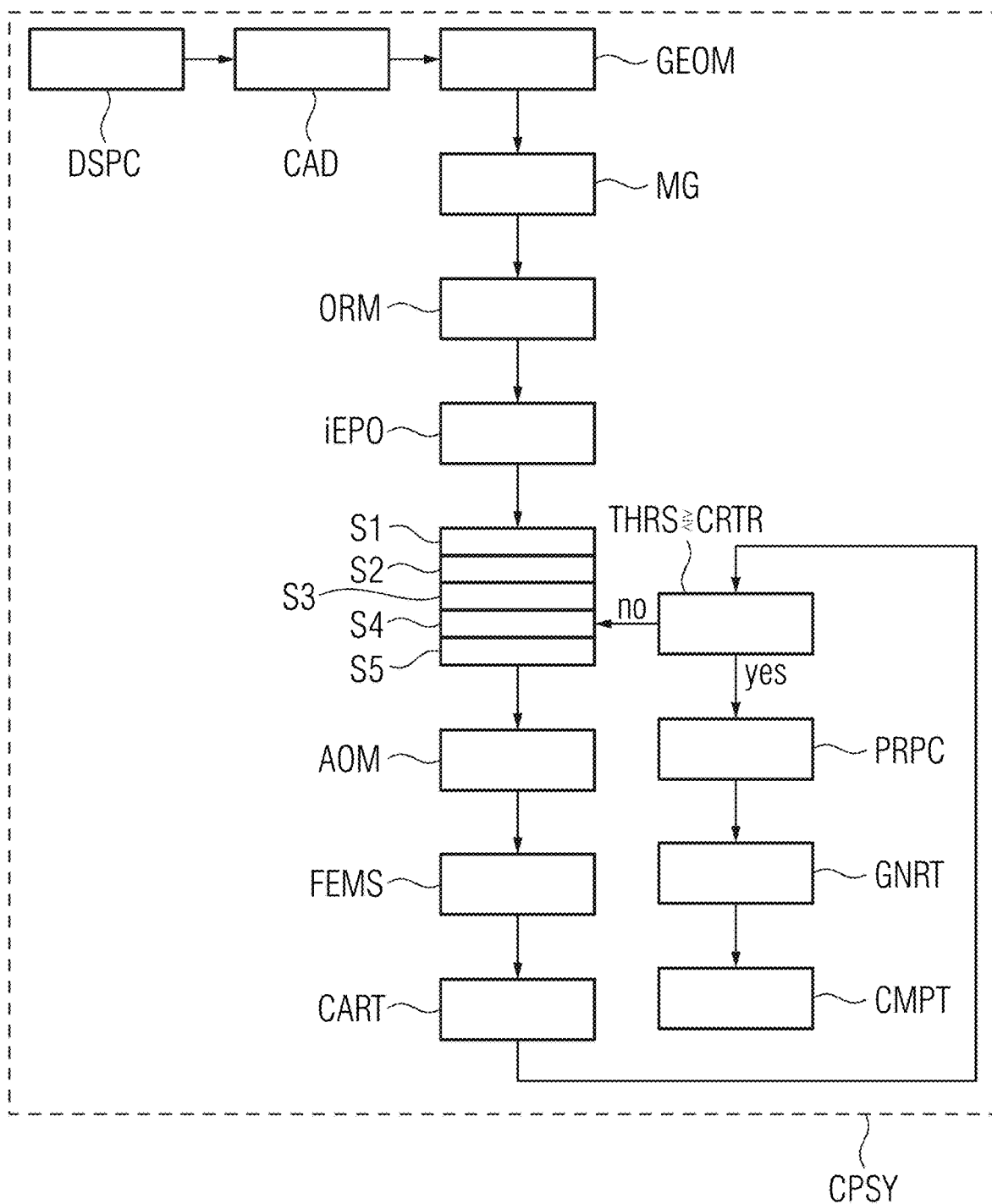

FIG. 4 includes the steps S1 to S5 as depicted in FIG. 3 that are embedded in a computer-implemented finite element mesh generation method that is in turn embedded in a method to generate a component (CMPT) according to a design specification (DSPC).

The process starts with providing a geometry model (GEOM) of a component that is used for generating an original mesh (ORM) based on the geometry model (GEOM). For any reason the original mesh ORM is separated from the geometry model (GEOM). This results in an original-input-orphan-mesh (IEPO). This kind of separation of the geometry model from the original mesh ORM may happen due to reasons like outdating of the file format of the geometry model GEOM or that the workflow is designed such that in a certain stage only the mesh ORM is transmitted to subsequent processing steps and later the geometry model GEOM became unavailable.

As an alternative, the original-input-orphan-mesh (IEPO) may be received as a stereolithographic file that may originate from an optical scan, one or several photos or the like.

Subsequently the above defined steps S1 to S5 are performed.

It may be evaluated if a repetition of the steps: S4) Generating a new mesh patch element NMPE based on the faces-on-mesh-object-geometry FOMF and at least one changed meshing-parameter CMPR, S5) Generating an amended orphan mesh AOM by replacing the orphan-element-patch-object OEPO of the original-input-orphan-mesh IEPO by the new mesh patch element NMPE, is required to obtain a better approximation to the design specification DSPC or to amend the calculation process or to obtain a more reliable calculation result that may be closer to some reference data meaning that the calculation results a more accurate. The steps may be repeated if a comparison of a criterion CRTR with a threshold THRS indicates that amendments may be necessary to reach an objective that may be calculation speed, calculation result accuracy, convergence characteristic, or other objectives.

Step S4 may be performed by a mesh partitioner MPM module.

The mesh partitioner MPM module may be understood as a module for logically clustering of elements into groups based on the detection of element edges discontinuities (discrete data) to recover patches of elements that are amenable to define a (continuous) surface.

From the discrete data the continuous geometrical entities may be basically reversed engineered (Vertex, edge, face etc. . . . ) and define a complete boundary representation used to define a CAD model.

Based on the amended orphan mesh AOM a finite element calculation FEMS may be performed to generate at least one calculation result CART. Post-processing PSPC of the at least one calculation result CART may show that information to a user. The calculation result CART may be displayed by table or graphs illustrating this information preferably easy for a user to quickly understand the result.

Finally, the component CMPT based on the design specification DSPC may be generated GNRT by any way of generating, e.g., conventional machining, additive manufacturing etc.

FIGS. 5-8 respectively depict different stages of the method for remeshing of an orphan mesh patch.

Figure 5:
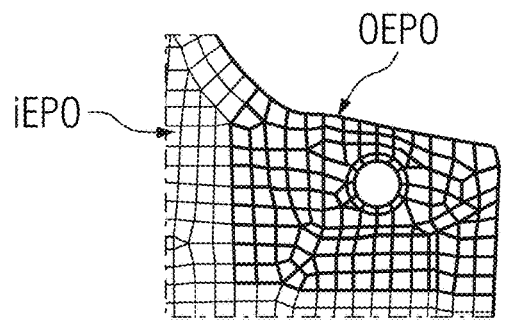
FIGS. 5, 6, 7, and 8 respectively depicts remeshing of an orphan mesh patch according to an embodiment.

FIG. 5 depicts step S2 of selecting and extracting at least a part of the original-input-orphan-mesh IEPO as an orphan-element-patch-object OEPO.

Figure 6:
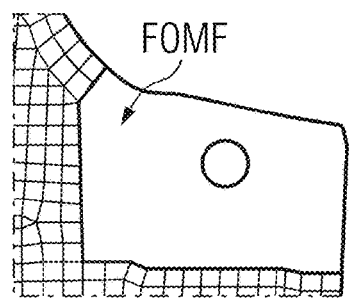

FIG. 6 depicts step S3 of generating faces on the orphan-element-patch-object OEPO as a faces-on-mesh-object geometry FOMF.

Figure 7:
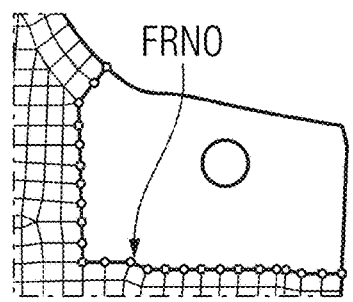

FIG. 7 depicts an optional step between step S3 und step S4 enabling to store frozen nodes FRNO on faces-on-mesh-object geometry FOMF. After selecting the orphan-element-patch-object OEPO frozen boundary edges of the patch are identified. Element edges that are connected to one element within the patch and one element outside the patch are identified and stored as frozen nodes FRNO. The frozen element edges may be stored in a format defined by the respective nodes defining their start-point and end-point.

Figure 8:
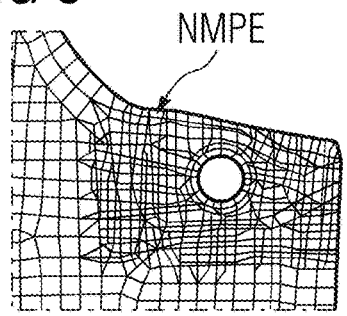

FIG. 8 depicts step S4 of generating a new mesh patch element NMPE based on: the faces-on-mesh-object-geometry FOMF and at least one changed meshing-parameter CMPR. The changed meshing-parameter CMPR is assigned to generate a new mesh patch element NMPE that is different to the corresponding original-input-orphan-mesh IEPO. This may be generating the new mesh patch element NMPE at a different size and/or as a different meshing type—respectively with a changed meshing-parameter CMPR.

Figure 9:
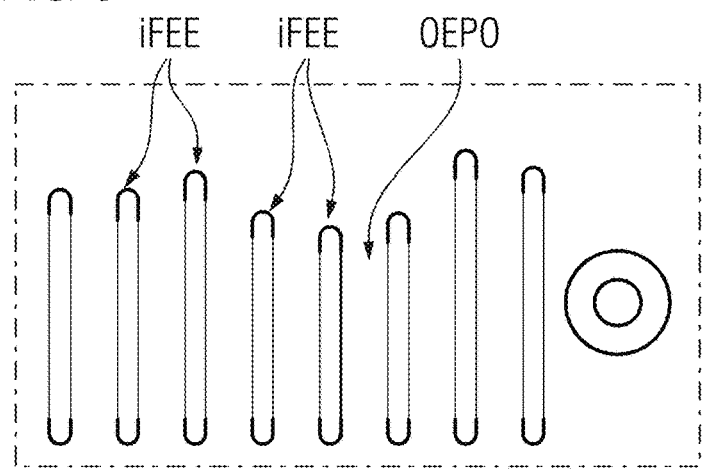
FIG. 9 depict an application of input-feature-element-edges corresponding to element edges of the original-input-orphan-mesh according to an embodiment.

FIG. 9 depicts an optional (an optional step between step S3 und step S4) selection of input-feature-element-edges IFEE that correspond to element edges of the original-input-orphan-mesh IEPO that are treated as spatially fixed during subsequent method steps respectively the during the remeshing. The selection of input-feature-element-edges IFEE is received by the mesh-partitioner-module MP and considered during the generation of the amended mesh AOM by the mesh generator MG. Selecting these input-feature-element-edges IFEE may be done by a user using a graphical user interface UI.

Figure 10:
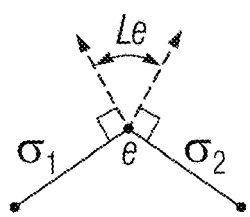
FIG. 10 depicts the geometry of a dihedral angle of a faces-on-mesh-object geometry edge according to an embodiment.

FIG. 10 depicts an illustration of a dihedral angle, that is illustrated to be an angle ∠e between the unit normal vectors on both sides of an edge e defined by surfaces σ1, σ2.

The face angle at edge e may be denoted by ∠e or angle ∠e between n1 and n2.

Given θ in the range (0, π) an edge e may be assigned to be a "strong edge" the new to-be-created faces-on-mesh-object FOMF geometry where the tessellation edges have a high dihedral angle ∠e. Referring to FIG. 10, given θ may be in the range (0, π) an edge e is θ-strong in face angle if ∠e≥θ.

Mutatis mutandis a "weak edge" may be where ∠e<θ. This means that the dihedral angle ∠e is not that high. It may not be equal zero degree (implying flat surface) but well below a feature angle threshold. The weak edges may be mostly ignored while creating faces-on-mesh-object geometry FOMF but at times will have to be honored to complete a feature boundary.

An edge may be classified a u-strong edge or an unconditionally strong edge USE when angle Le exceeds θ by a large amount. These edges may be identified in the new to-be-created faces-on-mesh-object FOMF geometry where the tessellation edges have a high dihedral angle Le. Such edges imply very sharp turns.

An edge may be called 1-Strong Edge or locally-strong-edge LSE when the angle is more than the limiting angle θ but less than a secondary high limit.

Figure 11:
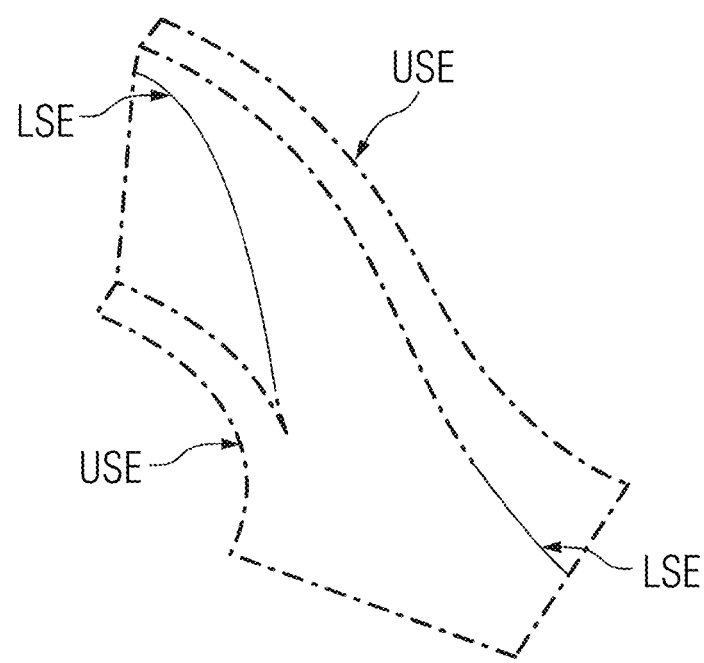
FIG. 11 depict different feature edge type classifications of a mesh partitioner module used by the method according to an embodiment.

This edge evaluation scheme may be applied by the mesh partitioner MP to identify strong and weak feature edges as generally illustrated in FIG. 11. The main steps may be outlined as:

1. The unconditionally strong edges USE are detected.
2. The locally strong edge LSE are identified.
3. Concave corners are detected, and shallow edges are uncovered.
4. Pruning of scar edges may be performed if needed (may be based on a jaggednesshigzaggedness measure).
5. Virtual Plane cut is performed if there are no unconditionally strong edges USE that are detected.

The following procedure may be applied: A) Start with a seed edge and B) Find the next best candidate edge according to these rules and rank the respective edge.

While creating and preserving features from the tessellation data (i.e., original-input-orphan-mesh IEPO) many features may be falsely identified, that may be categorized as 'false positives' and 'false negative' identified features. A false positive is a tessellation edge that mathematically qualifies as a strong edge but must be eventually ignored as it leads to no recognizable feature. False negative edges aren't identified as a strong edge but should be. These false negative edges mathematically do not qualify as strong edges but need to become geometry edges because they are part of essential—maybe recognizable—feature boundaries.

One embodiment provides the step of generating faces on the orphan-element-patch-object OEPO as a faces-on-mesh-object geometry FOMF additionally including a step of: solving a medial quadric at each vertex V for eigenvalues $0 \leq \lambda_3 \leq \lambda_2 \leq \lambda_1$ with eigenvectors $E_3, E_2, E_1$ as $A \cdot x = b$, wherein x is a 3×1 matrix and wherein A is a 3×3 normal matrix (symmetric, positive semi-definite $A = A^T$, $x^T \cdot A \cdot x \geq 0$)

with $A = \Sigma w_j N_j N_j^t$ with j=surrounding elements to vertex V, wherein $N_j$ is the unit normal vector to triangle j, wherein $w_j$ is the area-weight of triangle j, wherein b is a 3×1 matrix with $b = \Sigma w_j N_j$, wherein the solving for the eigenvalues $0 \leq \lambda_3 \leq \lambda_2 \leq \lambda_1$ with eigenvectors $E_3, E_2, E_1$ outputs $A = \lambda_j E_j E_j^t$, assigning geometrical properties to the respective vertex V: wherein the vertex V is a flat plane in case that exactly one large eigenvalue is determined (flat means A-rank 1 meaning that all normals are identical), wherein the vertex V is a ridge in case that exactly two large eigenvalues are determined (A is of the rank 2 meaning two distinct normal directions), and wherein the vertex V is a corner in case that three large eigenvalues determined (A is of rank 3 respectively full-rank).

The result of this processing of each vertex V for eigenvalues is shown in FIG. 11. The surface mesh illustrates the respective ridge direction. Further FIG. 11 depicts the difference between unconditionally strong edges USE when angle ∠e exceeds θ by a large amount, is shown in comparison with an 1-Strong Edge or locally-strong-edge LSE when the angle is more than the limiting angle θ but less than a secondary high limit.

Figure 12:
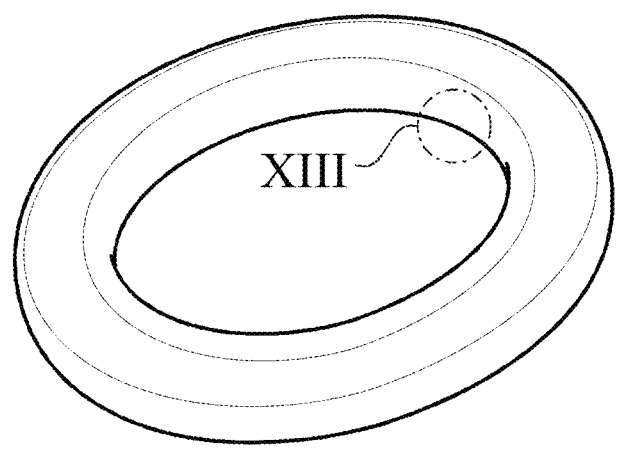
FIG. 12 depicts an input orphan mesh object according to an embodiment.
Figure 13:
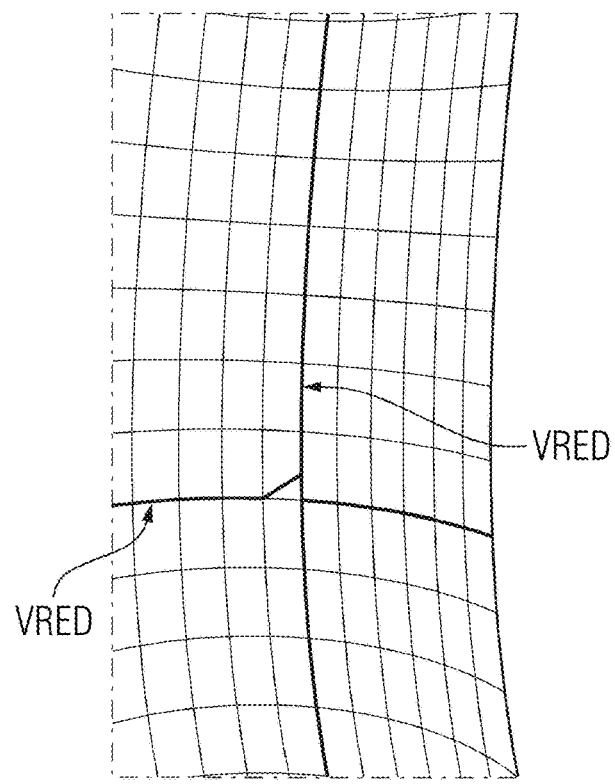
FIG. 13 depicts a detail XIII of FIG. 12 illustrating an intersection of two virtual edges of the input orphan mesh object according to an embodiment.
Figure 14:
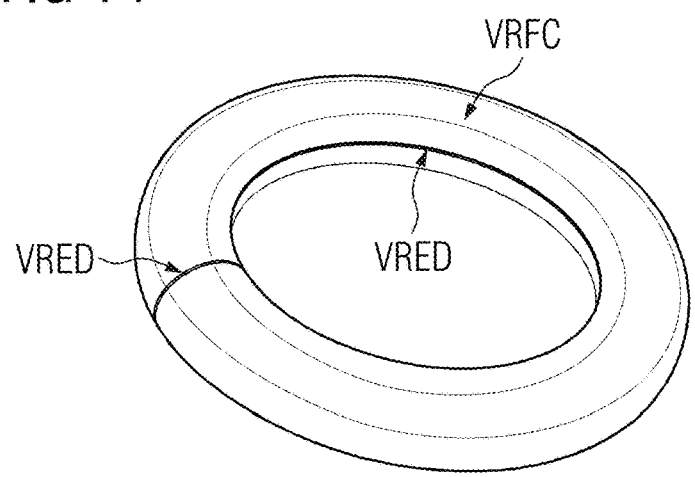
FIG. 14 depicts two virtual edges and one virtual face of the input-orphan-mesh-object as depicted in FIG. 12 according to an embodiment.

FIGS. 12 to 14 depict how faces-on-mesh-object geometry FOMF are generated using the mesh partitioning algorithm from orphan-element-patch-objects OEPO representing closed surfaces.

FIG. 12 depicts an annular orphan-element-patch-objects OEPO defining a closed surface that is a polygonal tessellation.

FIG. 13 depicts detail XIII of FIG. 12 illustrating an inter-section of two virtual edges VRED of the orphan-element-patch-objects OEPO, FIG. 14 depicts the two virtual edges VRED and one virtual face VRFC of the input-orphan-mesh-object as illustrated in FIG. 12.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A computer-implemented method of modifying a finite element mesh, the method comprising:

providing an original-input-orphan-mesh comprising a collection of connected nodes and elements that is separated from a parent geometry on which the collection of connected nodes and elements were originally created;

selecting and extracting at least a part of the original-input-orphan-mesh as an orphan-element-patch-object;

generating faces on the orphan-element-patch-object as a faces-on-mesh-object-geometry;

generating a new mesh patch element based on the faces-on-mesh-object-geometry and at least one changed meshing-parameter, wherein the changed meshing-parameter is assigned to generate the new mesh patch element that is different to a corresponding original-input-orphan-mesh; and generating an amended orphan mesh by replacing the orphan-element-patch-object of the original-input-orphan-mesh by the new mesh patch element.

2. The computer-implemented method of claim 1, further comprising before providing the original-input-orphan-mesh:

providing a geometry model of a component, generating an original mesh based on the geometry model; and separating the original mesh from the geometry model as an original-input-orphan-mesh to be provided;

and further comprising after the step of generating an amended orphan mesh:

performing a finite element calculation by applying the amended orphan mesh generating at least one calculation result.

3. The computer-implemented method of claim 2, further comprising after the step of performing the finite element calculation by applying the new mesh patch element:

post-processing the at least one calculation result.

4. The computer-implemented method of claim 3, wherein after post-processing the at least one calculation result the method further comprises:

evaluating if a repetition of:

generating a new mesh patch element based on the faces-on-mesh-object-geometry and at least one changed meshing-parameter;

generating the amended orphan mesh by replacing the orphan-element-patch-object of the original-input-orphan-mesh by the new mesh patch element, is required to obtain a better approximation to a design specification;

wherein after determining the repetition is required, repeating generating the new mesh patch element and generating the amended orphan mesh; and generating the component based on the design specification.

5. The computer-implemented method of claim 1, wherein before generating faces on the orphan-element-patch-object as a faces-on-mesh-object geometry, the method further comprises:

receiving boundary-frozen-element-edges comprising frozen nodes of the orphan-element-patch-object, wherein the frozen nodes are retained during the generating of a new mesh patch element such that no new nodes are created on these edges.

6. The computer-implemented method of claim 1, wherein before generating faces on the orphan-element-patch-object as a faces-on-mesh-object geometry, the method further comprises:

receiving input-feature-element-edges that correspond to element edges of the original-input-orphan-mesh that are treated as spatially fixed during subsequent method steps.

7. The computer-implemented method of claim 6, wherein receiving boundary-frozen-element-edges or receiving input-feature-element-edges includes:

providing boundary-frozen-element-edges or input-feature-element-edges by a user interface.

8. The computer-implemented method of claim 1, wherein generating faces on the orphan-element-patch-object as a faces-on-mesh-object geometry further includes:

changing mesh-elements of the orphan-element-patch-object into smaller or larger mesh-elements forming a basis for generating faces on the orphan-element-patch-object as a faces-on-mesh-object geometry.

9. The computer-implemented method of claim 1, wherein generating faces on the orphan-element-patch-object as a faces-on-mesh-object geometry comprises for identifying singularities of the faces-on-mesh-object geometry the following additional steps:

selecting an area from the faces-on-mesh-object geometry as a feature; assigning a respective criterium-score to the feature of the faces-on-mesh-object geometry for distinguishing between a first feature type and a second feature type selected from feature-types including flat plane, ridge, or corner;

calculating at least two respective algorithmic criterium scores applied to the feature;

determining a total score assigned to the feature as a weighted sum of the criterium scores; and comparing the total score to a predefined score-threshold and assigning the first feature type to the feature in case the total score is below the threshold, otherwise assigning the second feature type.

10. A non-transitory computer implemented storage medium that stores machine-readable instructions executable by at least one processor for modifying a finite element mesh, the machine-readable instructions comprising:

providing an original-input-orphan-mesh comprising a collection of connected nodes and elements that is separated from a parent geometry on which the collection of connected nodes and elements were originally created;

selecting and extracting at least a part of the original-input-orphan-mesh as an orphan-element-patch-object;

generating faces on the orphan-element-patch-object as a faces-on-mesh-object geometry;

generating a new mesh patch element based on the faces-on-mesh-object-geometry and at least one changed meshing-parameter, wherein the changed meshing-parameter is assigned to generate the new mesh patch element that is different to a corresponding original-input-orphan-mesh; and generating an amended orphan mesh by replacing the orphan-element-patch-object of the original-input-orphan-mesh by the new mesh patch element.

11. The non-transitory computer implemented storage medium of claim 10, wherein the machine-readable instructions further comprise before providing the original-input-orphan-mesh:

providing a geometry model of a component, generating an original mesh based on the geometry model; and separating the original mesh from the geometry model as an original-input-orphan-mesh to be provided;

and further comprising after the step of generating an amended orphan mesh:

performing a finite element calculation by applying the amended orphan mesh generating at least one calculation result.

12. The non-transitory computer implemented storage medium of claim 11, wherein the machine-readable instructions further comprise after the step of performing the finite element calculation by applying the new mesh patch element:

post-processing the at least one calculation result.

13. The non-transitory computer implemented storage medium of claim 12, wherein after post-processing the at least one calculation result the instructions further comprise:

evaluating if a repetition of:
generating a new mesh patch element based on the faces-on-mesh-object-geometry and at least one changed meshing-parameter;
generating the amended orphan mesh by replacing the orphan-element-patch-object of the original-input-orphan-mesh by the new mesh patch element,
is required to obtain a better approximation to a design specification;
wherein after determining the repetition is required, repeating generating the new mesh patch element and generating the amended orphan mesh; and
generating the component based on the design specification.

14. The non-transitory computer implemented storage medium of claim 10, wherein before generating faces on the orphan-element-patch-object as a faces-on-mesh-object geometry, the instructions further comprise:

receiving boundary-frozen-element-edges comprising frozen nodes of the orphan-element-patch-object, wherein the frozen nodes are retained during the generating of a new mesh patch element such that no new nodes are created on these edges.

15. The non-transitory computer implemented storage medium of claim 10, wherein before generating faces on the orphan-element-patch-object as a faces-on-mesh-object geometry, the instructions further comprise:

receiving input-feature-element-edges that correspond to element edges of the original-input-orphan-mesh that are treated as spatially fixed during subsequent method steps.

16. The non-transitory computer implemented storage medium of claim 15, wherein receiving boundary-frozen-element-edges or receiving input-feature-element-edges includes:

providing boundary-frozen-element-edges or input-feature-element-edges by a user interface.

17. The non-transitory computer implemented storage medium of claim 10, wherein generating faces on the orphan-element-patch-object as a faces-on-mesh-object geometry further includes:

changing mesh-elements of the orphan-element-patch-object into smaller or larger mesh-elements forming a basis for generating faces on the orphan-element-patch-object as a faces-on-mesh-object geometry.

18. The non-transitory computer implemented storage medium of claim 10, wherein generating faces on the orphan-element-patch-object as a faces-on-mesh-object geometry comprises for identifying singularities of the faces-on-mesh-object geometry the following additional instructions:

selecting an area from the faces-on-mesh-object geometry as a feature; assigning a respective criterium-score to the feature of the faces-on-mesh-object geometry for distinguishing between a first feature type and a second feature type selected from feature-types including flat plane, ridge, or corner;
calculating at least two respective algorithmic criterium scores applied to the feature;
determining a total score assigned to the feature as a weighted sum of the criterium scores; and
comparing the total score to a predefined score-threshold and assigning the first feature type to the feature in case the total score is below the threshold, otherwise assigning the second feature type.

* * * * *